(12) United States Patent
Reeswinkel et al.

(10) Patent No.: US 10,840,413 B2
(45) Date of Patent: Nov. 17, 2020

(54) OPTOELECTRONIC DEVICE AND METHOD OF PRODUCING AN OPTOELECTRONIC DEVICE

(71) Applicant: OSRAM OLED GmbH, Regensburg (DE)

(72) Inventors: Thomas Reeswinkel, Regensburg (DE); Richard Scheicher, Thierhaupten (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/326,985

(22) PCT Filed: Aug. 24, 2017

(86) PCT No.: PCT/EP2017/071344
§ 371 (c)(1),
(2) Date: Feb. 21, 2019

(87) PCT Pub. No.: WO2018/037083
PCT Pub. Date: Mar. 1, 2018

(65) Prior Publication Data
US 2019/0181303 A1 Jun. 13, 2019

(30) Foreign Application Priority Data

Aug. 26, 2016 (DE) .................. 10 2016 115 921

(51) Int. Cl.
*H01L 33/46* (2010.01)
*H01L 33/60* (2010.01)
(Continued)

(52) U.S. Cl.
CPC ............ *H01L 33/46* (2013.01); *H01L 33/405* (2013.01); *H01L 33/44* (2013.01); *H01L 33/60* (2013.01); *H01L 2933/0025* (2013.01)

(58) Field of Classification Search
CPC ....... H01L 33/46; H01L 33/405; H01L 33/44; H01L 33/60; H01L 2933/0025
See application file for complete search history.

(56) References Cited

U.S. PATENT DOCUMENTS

2004/0229051 A1   11/2004   Schaepkens et al.
2006/0186428 A1   8/2006   Tan et al.
(Continued)

FOREIGN PATENT DOCUMENTS

CN         103724519 A     4/2014
DE   10 2015 102 870 A1   9/2016
(Continued)

OTHER PUBLICATIONS

Search Report dated Mar. 25, 2020, of counterpart Japanese Application No. 2019-511445, along with an English translation.
(Continued)

*Primary Examiner* — Peter Bradford
(74) *Attorney, Agent, or Firm* — DLA Piper LLP (US)

(57) ABSTRACT

An optoelectronic device includes at least one optoelectronic semiconductor chip that emits radiation, at least one metallic reflecting surface, at least one functional component having a component surface different from the metallic reflecting surface, and a barrier layer stack for protection against corrosive gases arranged both on the at least one metallic reflecting surface and the component surface, wherein the barrier layer stack includes at least one inorganic oxide, oxynitride or nitride layer and at least one plasma-polymerized siloxane layer.

17 Claims, 4 Drawing Sheets

(51) Int. Cl.
*H01L 33/44* (2010.01)
*H01L 33/40* (2010.01)

(56) References Cited

U.S. PATENT DOCUMENTS

| | | | |
|---|---|---|---|
| 2011/0143126 A1* | 6/2011 | Meyer | C08L 69/00 428/334 |
| 2011/0151262 A1* | 6/2011 | Heuer | C07D 209/46 428/412 |
| 2013/0181236 A1 | 7/2013 | Tamaki et al. | |
| 2014/0106111 A1 | 4/2014 | Nam et al. | |
| 2014/0113146 A1* | 4/2014 | Haack | B05D 5/068 428/425.5 |
| 2014/0329071 A1* | 11/2014 | Meyer | G02B 5/0808 428/215 |
| 2015/0023026 A1 | 1/2015 | Sakamoto et al. | |
| 2015/0108453 A1 | 4/2015 | Oh et al. | |
| 2015/0299465 A1* | 10/2015 | Toyota | C08G 65/22 257/98 |
| 2016/0108240 A1 | 4/2016 | Kashiwagi et al. | |
| 2017/0033269 A1* | 2/2017 | Yamabe | C09D 183/04 |
| 2017/0369721 A1* | 12/2017 | Komatsu | C07D 253/02 |
| 2018/0212113 A1* | 7/2018 | Rantala | H01L 33/56 |
| 2019/0048202 A1* | 2/2019 | Frauenrath | C09D 5/00 |
| 2019/0344642 A1* | 11/2019 | Meyer | B60J 1/00 |

FOREIGN PATENT DOCUMENTS

| | | |
|---|---|---|
| DE | 10 2016 106 494 A1 | 10/2017 |
| DE | 10 2016 111 566 A1 | 12/2017 |
| EP | 2 858 128 A1 | 4/2015 |
| JP | 02-250304 A | 10/1990 |
| JP | 08-072193 A | 3/1996 |
| JP | 2003-205575 A | 7/2003 |
| JP | 2010-0097065 A | 4/2010 |
| JP | 2015-160192 A | 9/2015 |
| JP | 2015-207633 A | 11/2015 |
| JP | 2016-079320 A | 5/2016 |
| JP | 2016-087815 A | 5/2016 |
| WO | 98/47189 A1 | 10/1998 |
| WO | 01/61069 A2 | 8/2001 |
| WO | 2015/159371 A1 | 10/2015 |

OTHER PUBLICATIONS

Notice of Reasons for Refusal dated Apr. 9, 2020, of counterpart Japanese Application No. 2019-511445, along with an English translation.

* cited by examiner

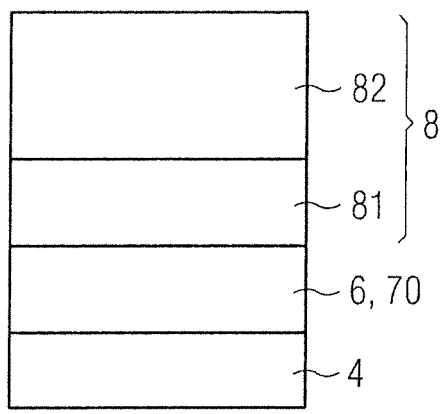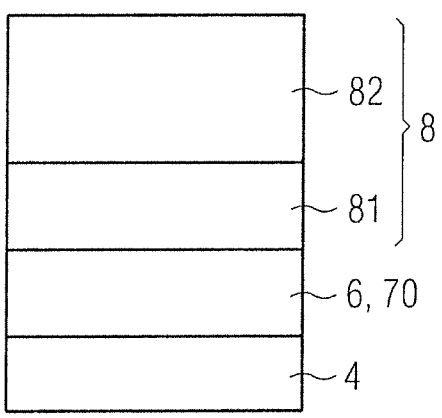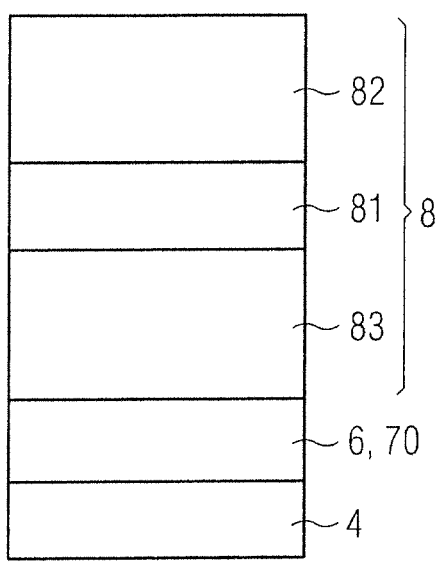

OPTOELECTRONIC DEVICE AND METHOD OF PRODUCING AN OPTOELECTRONIC DEVICE

TECHNICAL FIELD

This disclosure relates to an optoelectronic device and a method of producing an optoelectronic device.

BACKGROUND

Optoelectronic devices generally have silver-coated surfaces, for example, silver-coated substrates since silver has a high reflectivity over the visible spectral range. However, silver is very sensitive to corrosion, especially to corrosive media such as gases, liquids, environmental influences, for example, hydrogen sulfide. In contact with corrosive media, the surface of the silver becomes dark, in particular brown to black. As a result, less light can be reflected. In addition, the reflection is wavelength-dependent, for example, in brown coloration. The optoelectronic device therefore shines darker and in a different, non-desired light color. Due to the high requirement for the brightness and color stability, optoelectronic devices are generally encapsulated with silicone since silicones have a higher light stability and lower aging compared to epoxy resins. However, it has been found that silicones have a high gas permeability so that corrosive media, for example, corrosive gases can easily penetrate to the surface of the silver. The optoelectronic device is therefore light- and color-stable, but sensitive to corrosive gases occurring in particular during operation in road traffic.

It could therefore be helpful to provide an optoelectronic device that is stable against corrosive gases and a method of producing an optoelectronic device that generates a stable device.

SUMMARY

We provide an optoelectronic device including at least one optoelectronic semiconductor chip that emits radiation, at least one metallic reflecting surface, at least one functional component having a component surface different from the metallic reflecting surface, and a barrier layer stack for protection against corrosive gases arranged both on the at least one metallic reflecting surface and the component surface, wherein the barrier layer stack includes at least one inorganic oxide, oxynitride or nitride layer and at least one plasma-polymerized siloxane layer.

We also provide a method of producing an optoelectronic device including A) providing at least one optoelectronic semiconductor chip that emits radiation, at least one metallic reflecting surface and at least one functional component having a component surface different from the metallic reflecting surface, and B) applying a barrier layer stack for protection against corrosive gases both on the at least one metallic reflecting surface and the component surface, wherein the barrier layer stack is formed by producing at least one inorganic oxide, oxynitride or nitride layer and at least one plasma-polymerized siloxane layer.

BRIEF DESCRIPTION OF THE DRAWINGS

FIGS. 2A to 2C each show a schematic cross-sectional view of a barrier layer stack according to an example.

Figure 1A:
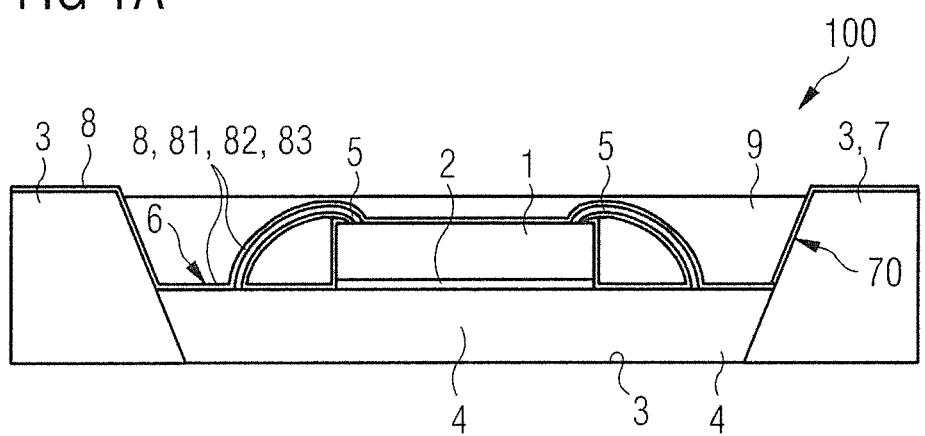
FIGS. 1A and 1B each show a schematic cross-sectional view of an optoelectronic device according to an example.

REFERENCES 100 optoelectronic device
1 semiconductor chip
2 adhesive
3 housing
4 lead frame, carrier
5 bonding wire
6 metallic reflecting surface
7 component
70 component surface
8 barrier layer stack
81 inorganic oxide, oxynitride or nitride layer
82 plasma-polymerized siloxane layer
83 further plasma-polymerized siloxane layer
9 encapsulation
10 contact, metallization

DETAILED DESCRIPTION

Our optoelectronic device may have an optoelectronic semiconductor chip. The optoelectronic semiconductor chip emits radiation. The device may have at least one metallic reflecting surface and at least one functional component. The functional component may have at least one component surface. The component surface may be different from the metallic reflecting surface. The device may have a barrier layer stack. The barrier layer stack protects against corrosive media or gases. The barrier layer stack may be arranged on both the at least one metallic reflecting surface and the component surface. The barrier layer stack may have at least one inorganic oxide layer or an inorganic oxynitride layer or an inorganic nitride layer and at least one plasma-polymerized siloxane layer.

The optoelectronic device may be a light-emitting diode (LED). The optoelectronic device preferably emits yellow, blue, red, orange, green or white light.

The optoelectronic device may comprise at least one optoelectronic semiconductor chip. The optoelectronic semiconductor chip may have a semiconductor layer sequence. The semiconductor layer sequence of the semiconductor chip is preferably based on a III-V compound semiconductor material. The semiconductor material is preferably a nitride compound semiconductor material such as $Al_nIn_{1-n-m}Ga_mN$ or else a phosphide compound semiconductor material such as $Al_nIn_{1-n-m}Ga_mP$, wherein $0 \leq n \leq 1$, $0 \leq m \leq 1$ and $n+m \leq 1$. The semiconductor material can likewise be $Al_xGa_{1-x}As$ where $0 \leq x \leq 1$. In this example, the semiconductor layer sequence can have dopants and additional constituents. For the sake of simplicity, however, only the essential components of the crystal lattice of the semiconductor layer sequence are indicated, i.e., Al, As, Ga, In, N or P, even if these can be partially replaced and/or supplemented by small quantities of further substances.

The semiconductor layer sequence comprises an active layer having at least one pn junction and/or having one or more quantum well structures. During operation of the semiconductor chip, an electromagnetic radiation is generated in the active layer. A wavelength of the radiation is preferably in the ultraviolet, IR and/or visible spectral range, in particular at wavelengths of 420 nm to 680 nm, for example, 440 nm to 480 nm.

The optoelectronic device may have at least one metallic reflecting surface. The metallic reflecting surface is preferably formed from silver or consists of silver or a silver-containing alloy. In addition to the good electrical and thermal connection to the semiconductor chip, silver has a very high reflectivity across the visible spectral range and thus increases the brightness and/or the efficiency of the optoelectronic device. This is advantageous, in particular, in optoelectronic devices designed with adhesively bonded volume-emitter semiconductor chips since a majority of the light or radiation emitted by the semiconductor chip impinges on the metallic reflecting surface.

The metallic reflecting surface may be deposited by sputtering, plasma-enhanced chemical vapor deposition (PECVD) or atomic layer deposition (ALD).

The metallic reflecting surface may have a reflectivity of greater than 90 percent, preferably greater than 95 percent, particularly preferably greater than 99 percent. Preferably, the metallic reflecting surface is sensitive to corrosive gases. In other words, the metallic reflecting surface reacts with corrosive gases such as hydrogen sulfide to a chemical compound having a different physical and/or chemical property than the metallic reflecting surface. For example, silver and hydrogen sulfide react in the following reaction to form silver sulfide, which is dark-colored and reduces the reflectivity of the silver:

$2Ag + H_2S \rightarrow Ag_2S + 2H^+ + 2e^-$.

The device may have a functional component. The functional component is preferably selected from the following group or combinations thereof: semiconductor chip, ESP semiconductor chip, bonding wire, carrier, lead frame, plastic housing, housing, adhesive to fasten the semiconductor chip (chip adhesive) or chip interconnect. The main benefit of the plasma-polymerized siloxane layer is momentarily the extended protection in the region of the chip adhesive (a single thin inorganic layer rapidly breaks on the soft polymer substrate, for example, made of silicone. In principle, a simple oxide layer offers sufficient protection if it remains intact.

The plasma-polymerized siloxane layer is therefore not absolutely necessary to improve the (intrinsic) permeability of the layer or layer stack, but, in the event of mechanical damage primarily to the (brittle) oxide layer, to seal this "crack" to some extent.

The functional component has at least one component surface. The component surface is different from the metallic reflecting surface. Preferably, each surface comprising or consisting of silver is referred to as a metallic reflecting surface. Each surface, which is free of silver, is preferably referred to as a component surface. The component surface can be non-metallic or metallic. For example, the component surface is the surface of a semiconductor chip, preferably the radiation emitting surface or the side areas of the semiconductor chip, of the chip adhesive or of the chip interconnect, the surface of the bonding wire, the surface of a carrier, the surface of a lead frame and/or the surface of a plastic housing.

The device may have a barrier layer stack. The barrier layer stack preferably protects the metallic reflecting surface and/or the functional component with the component surface from corrosive media, in particular from hydrogen sulfide. Alternatively or additionally, the barrier layer stack can also protect the surfaces from environmental influences such as the exposure of temperature change and humidity.

The barrier layer stack is preferably arranged on both the at least one metallic reflecting surface and the component surface. The arrangement can be directly, that is to say immediately, or indirectly, that is to say mediately. The term directly here refers to the fact that no further elements or layers such as, for example, adhesive layers are arranged between the barrier layer stack and the surfaces. The term indirectly refers to the fact that further elements or layers can be present between the barrier layer stack and the surfaces.

A layer stack comprising at least one inorganic oxide layer and/or an inorganic oxynitride layer and/or an inorganic nitride layer and at least one plasma-polymerized siloxane layer is referred to as a barrier layer stack. In other words, the barrier layer stack has a plural-layer or multi-layer structure. The barrier layer stack preferably has a high transparency in the visible spectral range. Transparency means a transmission in the visible spectral range of at least 80%, in particular at least 90%, particularly preferably at least 95%.

The inorganic oxide, oxynitride or nitride layer may contain oxides, oxynitrides or nitrides of one or more elements of the following group: silicon, aluminum, titanium, zinc, indium, tin, niobium, tantalum, hafnium, zirconium, yttrium, germanium. The inorganic oxide, oxynitride or nitride layer can also be formed from other oxides, oxynitrides or nitrides as transparent as possible in the visible spectral range.

The inorganic oxide layer may be formed from or comprises silicon oxide, aluminum oxide, titanium oxide, zinc oxide, indium oxide, tin oxide, tantalum oxide, niobium oxide, hafnium oxide, zirconium oxide or yttrium oxide. The inorganic nitride layer may be formed from or comprises silicon nitride, aluminum nitride or germanium nitride.

The inorganic oxide, oxynitride or nitride layer may have a layer thickness of 5 nm to 100 nm, particularly preferably 15 nm to 65 nm, for example, 40 nm. The inorganic oxide, oxynitride or nitride layer is therefore very thin, can be brittle and therefore very sensitive to mechanical influences, as can occur, for example, during the further processing of the device or during the subsequent assembly process, as a result of which cracks or other defects can arise in the inorganic oxide, oxynitride or nitride layer. The inorganic oxide, oxynitride or nitride layer has a high barrier effect against corrosive media such as hydrogen sulfide or other harmful gases. The inorganic oxide, oxynitride or nitride layer can be deposited by physical vapor deposition (PVD) or chemical vapor deposition such as, for example, PECVD, or atomic layer deposition (ALD).

The barrier layer stack may have a plasma-polymerized siloxane layer. In this example, a plasma-polymerized siloxane layer means a layer produced by plasma polymerization in which organic precursors are supplied during the deposition. Plasma polymerization is a special plasma-activated variant of chemical vapor deposition (PECVD). In plasma polymerization, vaporous organic precursor compounds, i.e., precursor materials, are first activated by a plasma in a process chamber. As a result of the activation, ionic molecules are formed and first molecule fragments in the form of clusters or chains are already formed in the gas phase. The subsequent condensation of these fragments onto the corresponding surfaces then causes polymerization under the influence of temperature, electron and ion bombardment and thus formation of a plasma-polymerized siloxane layer. Preferably, the plasma polymerization is carried out in a vacuum or under atmospheric pressure. The precursor can be selected from the following group: hexamethyldisiloxane, tetramethyldisiloxane, divinyltetramethyldisiloxane. The plasma-polymerized siloxane layer preferably has polymerized Si—O units.

The inorganic oxide, oxynitride or nitride layer is comparatively brittle, while the plasma-polymerized siloxane layer still has a residual content of organic material or carbon or hydrocarbon chains and is therefore less brittle and somewhat softer.

The plasma-polymerized siloxane layer may have a layer thickness of 5 nm to 2 µm, preferably 25 nm to 500 nm, for example, 250 nm. In other words, the plasma-polymerized siloxane layer is preferably formed thicker than the inorganic oxide, oxynitride or nitride layer. The plasma-polymerized siloxane layer is less prone to cracking compared to the inorganic oxide layer. Depending on the type of corrosive media, the plasma-polymerized siloxane forms a somewhat poorer barrier protection without the combination with the inorganic oxide, oxynitride or nitride layer. The plasma-polymerized siloxane layer has a high mechanical strength compared to the oxide, oxynitride or nitride layer since it is more flexible and ductile and is less prone to cracking. The coefficient of thermal expansion is more similar to that of the surfaces to be coated so that the mechanical stresses occurring in the event of temperature jumps are lower compared to an inorganic oxide, oxynitride or nitride layer.

We recognized that the use of a barrier layer stack comprising a combination of an inorganic oxide, oxynitride or nitride layer and a plasma-polymerized siloxane layer, can protect the surfaces in the device from corrosive media and other environmental influences. Thus, both silver surfaces and silver-free surfaces, preferably all of the surfaces that are freely accessible during application of the barrier layer stack are coated with the barrier layer stack. A barrier effect can thus be produced in a simple manner without having to distinguish between the surfaces. In comparison thereto, conventional barrier layers having an inorganic oxide, oxynitride or nitride layer frequently show cracks in these layers. These cracks can arise, for example, during the soldering of an optoelectronic device or a further component or by temperature fluctuations or other environmental influences during later operation. In such an example, corrosive media can reach the metallic reflecting surface and the component surface, preferably the metallic reflecting silver surface so that corrosion occurs around the crack in this region.

The barrier layer stack may have at least one layer structure made of an inorganic oxide, oxynitride or nitride layer and a plasma-polymerized siloxane layer. Preferably, a plurality of oxide, oxynitride or nitride layers and a plurality of plasma-polymerized siloxane layers can also form the barrier layer stack.

The plasma-polymerized siloxane layer may be directly subordinated to both the at least one metallic reflecting surface and the component surface and the inorganic oxide, oxynitride or nitride layer is subordinated to the plasma-polymerized siloxane layer. In other words, the barrier layer stack has a layer structure comprising at least two layers with the sequence of plasma-polymerized siloxane layer and inorganic oxide, oxynitride or nitride layer.

The plasma-polymerized siloxane layer or a further plasma-polymerized siloxane layer may be subordinated directly to both the at least one metallic reflecting surface and the component surface and the inorganic oxide, oxynitride or nitride layer may be subordinated to the plasma-polymerized siloxane layer or the further plasma-polymerized siloxane layer. In addition, a further plasma-polymerized siloxane layer or the plasma-polymerized siloxane layer may be subordinated to the inorganic oxide, oxynitride or nitride layer. In other words, the barrier layer stack may have a layer structure comprising at least three layers having the sequence plasma-polymerized siloxane layer, inorganic oxide, oxynitride or nitride layer and further plasma-polymerized siloxane layer or with the sequence of further plasma-polymerized siloxane layer, inorganic oxide, oxynitride or nitride layer and plasma-polymerized siloxane layer. The further plasma-polymerized siloxane layer can have the previously described materials and examples of the plasma-polymerized siloxane layer.

The barrier layer stack may cover, at least in regions, preferably completely, the surfaces of a semiconductor chip, the surfaces of a contact and/or the surfaces of the housing. In other words, a semiconductor chip, a contact and a housing are provided during production and then the barrier layer stack is applied to all exposed surfaces. For the barrier layer stack, it is therefore not absolutely necessary to be applied selectively to the metallic reflecting surface, but can also be applied to further functional components over the entire surface. Thus, process steps and time can be saved.

The inorganic oxide, oxynitride or nitride layer may be directly subordinated to both the at least one metallic reflecting surface and the component surface, and the plasma-polymerized siloxane layer is subordinated to the inorganic oxide, oxynitride or nitride layer. In other words, the barrier layer stack has a sequence of inorganic layer and plasma-polymerized siloxane layer in the direction away from the surfaces.

The plasma-polymerized siloxane layer or the further plasma-polymerized siloxane layer may form the final layer of the barrier layer stack. This is advantageous because the surface properties can be set in a targeted manner via the deposition conditions, and can be adapted in this way, for example, with regard to adhesion of the subsequent casting material.

Deposition of a plasma-polymerized siloxane layer can specifically modified and adjusted by selection of the precursor, that is to say of the monomer composition and via the precise process control, in particular by the plasma power and the precursor-to-oxygen ratio. In particular, the process parameters can be used to adjust the barrier effect, the gas diffusion, the optical transparency, the adhesion, the mechanical properties such as, for example, the coefficient of expansion and the surface energy. These parameters can also be changed during deposition.

The barrier layer stack may have exactly one combination of an inorganic oxide, oxynitride or nitride layer with a plasma-polymerized siloxane layer. A corresponding process flow for an optoelectronic device could therefore appear as follows. First, a semiconductor chip could be applied. The contacting could subsequently take place. Subsequently, an inorganic oxide, oxynitride or nitride layer could be deposited. Subsequently, the plasma-polymerized siloxane layer could be deposited. The device could be encapsulated and subsequently singulated. Alternatively, a reverse sequence in the layer stack is also possible, that is to say first application of a plasma-polymerized siloxane layer and subsequently application of an inorganic oxide, oxynitride or nitride layer. In this case, the mechanical stresses at the interfaces of the different substrate materials can be matched to a lesser extent to the brittle inorganic oxide, oxynitride or nitride layer, and thus the crack formation is reduced. However, the corrosive media, which can penetrate through the nevertheless formed cracks in the inorganic oxide, oxynitride or nitride layer, can under certain circumstances be spread better in the plasma-polymerized siloxane layer close to the substrate and have a corrosive effect on a larger surface.

To further improve the protective effect, layers can therefore additionally be deposited, for example, a combination of plasma-polymerized siloxane layer, inorganic oxide, oxynitride or nitride layer and a further plasma-polymerized siloxane layer, wherein the plasma-polymerized siloxane layer simultaneously forms the final layer. With regard to the above-described problem, this barrier layer stack has proven to be advantageous such that it is outstandingly stable against corrosive media.

The metallic reflecting surface and the component surface can be pretreated or cleaned prior to applying the barrier layer stack. The cleaning can be carried out, for example, by plasma treatment. By controlling the process control, primarily by controlling the oxygen partial pressure, the surface energy or the surface chemistry of the plasma-polymerized siloxane layer can additionally be specifically adjusted. As a result, the surface energy can also be adjusted within a wide range and thus adapted to the materials for the encapsulation, which is formed, for example, from silicone, with regard to optimized properties.

A final surface functionalization can be carried out, for example, by plasma treatment to further improve adhesion of an encapsulation.

We also provide a method of producing an optoelectronic device. The method is preferably used to produce our optoelectronic device. In particular, all the examples of the optoelectronic device apply both for the process and for the device.

The method may comprise the following steps:
A) provision of at least one optoelectronic semiconductor chip that emits radiation, at least one metallic reflecting surface and at least one functional component having a component surface different from the metallic reflecting surface, and
B) application of a barrier layer stack for protection against corrosive media both on the at least one metallic reflective surface and on the component surface, wherein the barrier layer stack is formed by producing at least one inorganic oxide, oxynitride or nitride layer and a plasma-polymerized siloxane layer.

One or more deposition parameters may be varied during deposition of the plasma-polymerized siloxane layer, for example, gas flows or plasma power as a result of which the plasma-polymerized siloxane layer can have gradients, for example, in the oxygen content or the optical properties.

The plasma-polymerized siloxane layer may be produced with an oxygen gradient. In particular, application of the plasma-polymerized siloxane layer takes place at the beginning of the processing without the supply of oxygen, while upon reaching a certain layer thickness, for example, of 50 nm the oxygen gradient is continuously or discretely increased.

Prior to step B), the metallic reflecting surface and/or the component surface may be treated by plasma. This step can be carried out to clean the surfaces and thus increase the adhesion of the barrier layer stack.

Application of the barrier layer stack may take place after generation of an electrical contact. This can be carried out on a lead frame-based construction or on a ceramic substrate-based construction.

Further advantages and developments result from the examples described below in conjunction with the figures.

In the examples and figures, similar, identical or identically acting elements can each be provided with the same reference symbols. The elements illustrated and their proportions among one another are not to be regarded as true to scale. Rather, individual elements such as, for example, layers, components, devices and regions can be represented with an exaggerated size for better representability and/or for a better understanding.

FIG. 1A shows a schematic cross-sectional view of an optoelectronic device 100 according to an example. The optoelectronic device 100 has a carrier 4. The carrier 4 can also be a lead frame. Furthermore, the device 100 has a housing 3 and a semiconductor chip 1. The semiconductor chip 1 preferably emits radiation from the blue, green or red spectral range. The semiconductor chip 1 is applied to the carrier 4 by a chip adhesive. The semiconductor chip 1 is electrically contacted by a bonding wire 5 to the lead frame or carrier 4. The device 100 has component surfaces 70 (not shown here). The component surfaces are all surfaces of the components 7 accessible prior to casting that are not metallic reflecting surfaces 6, i.e., preferably no silver surfaces. For example, the barrier layer stack 8 is arranged on the surface of the housing, on the surface of the bonding wire, on the radiation emission surface and on the side surfaces of the semiconductor chip 1 and/or on the surface of the carrier 4. The barrier layer stack 8, which preferably comprises a multilayer layer stack comprising at least one inorganic oxide, oxynitride or nitride layer and a plasma-polymerized siloxane layer, is applied to the freely accessible surfaces, that is to say on the component surfaces 70 and on the metallic reflecting surfaces 6 that are preferably formed from silver. Therefore, the barrier layer stack 8 can protect in particular the metallic reflecting surfaces 6 from environmental influences such as corrosive gases. The semiconductor chip 1 can be encapsulated. The encapsulation 9 can, for example, be formed from silicone. The encapsulation 9 can comprise, for example, converter materials such as, for example, YAG phosphors.

The barrier layer stack is preferably applied after the contacting, that is to say after the bonding wires have been applied. The barrier layer stack 8 can be produced from an inorganic layer and a siloxane layer polymerized by plasma. Silver or silver alloys, for example, can be present as the reflective metallic surface 6. The semiconductor chip 1 can be applied to the carrier 4 by an adhesive layer 2. The bonding wire 5 can be formed from gold, silver or alloys thereof. The lead frame or the support 4 can be formed from silver.

Figure 1B:
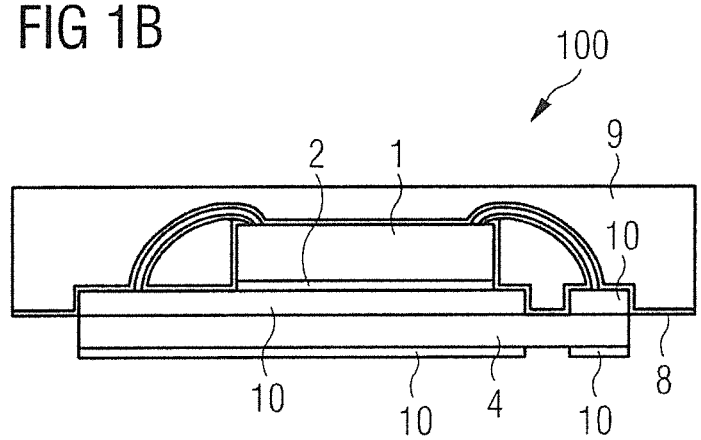

FIG. 1B shows a schematic cross-sectional view of an optoelectronic device according to an example. The device 100 of FIG. 1B differs from the device of FIG. 1A, in particular such that it does not have a prefabricated housing or cavity 3. The semiconductor chip 1 is applied to a contacting or metallization 10 via an adhesive layer 2. The metallization 10 can be arranged on a carrier 4, for example, made of ceramic. The barrier layer stack 1 can cover all freely accessible surfaces. The barrier layer stack 8 preferably covers both the surfaces of the bonding wire and the semiconductor chip and the metallization or contacting 10.

FIGS. 2A to 2C each show a barrier layer stack according to an example. FIGS. 2A to 2C show a carrier 4 or lead frame 4, which can also be absent. FIGS. 2A to 2C each show a metallic reflecting surface and a component surface 6, 70. A barrier layer stack 8 can be produced on this metallic surface 6 and the component surface 70. The barrier layer stack 8 can have different configurations. If the carrier comprises silver, the carrier surface is a metallic reflecting surface.

FIG. 2A shows that the barrier layer stack 8 comprises an inorganic oxide, oxynitride or nitride layer 81 and directly subordinated a plasma-polymerized siloxane layer 82. The plasma-polymerized siloxane layer 82 can be produced with an oxygen gradient, as shown in FIG. 2A, or without an oxygen gradient as shown in FIG. 2B.

The FIG. 2C differs in particular from FIGS. 2A and 2B in that the barrier layer stack 8 has three layers. A further plasma-polymerized siloxane layer 83 is subordinated to the surfaces 6, 70. The further plasma-polymerized siloxane layer 83 is produced, for example, by hexamethyldisiloxane (HMDSO) as a precursor without oxygen gradients. An inorganic oxide, oxynitride or nitride layer 81 is subordinated to the plasma-polymerized siloxane layer 83. The plasma-polymerized siloxane layer 82 is subordinated to of the inorganic oxide, oxynitride or nitride layer 81. The plasma-polymerized siloxane layer 82 can be produced by HDMSO as a precursor and without an oxygen gradient. Alternatively, the plasma-polymerized siloxane layers 82, 83 can also be produced by an oxygen gradient.

For example, materials such as silicon dioxide, aluminum oxide or other materials that can be produced by physical vapor deposition (PVD), chemical vapor deposition (PECVD) or atomic layer deposition (ALD), can be used as inorganic oxide, oxynitride or nitride layers.

The examples described here, that is to say the multilayer coating of the barrier layer stack 8, are not restricted. Alternatively, more than three layers can also form the barrier layer stack 8.

Figure 3:
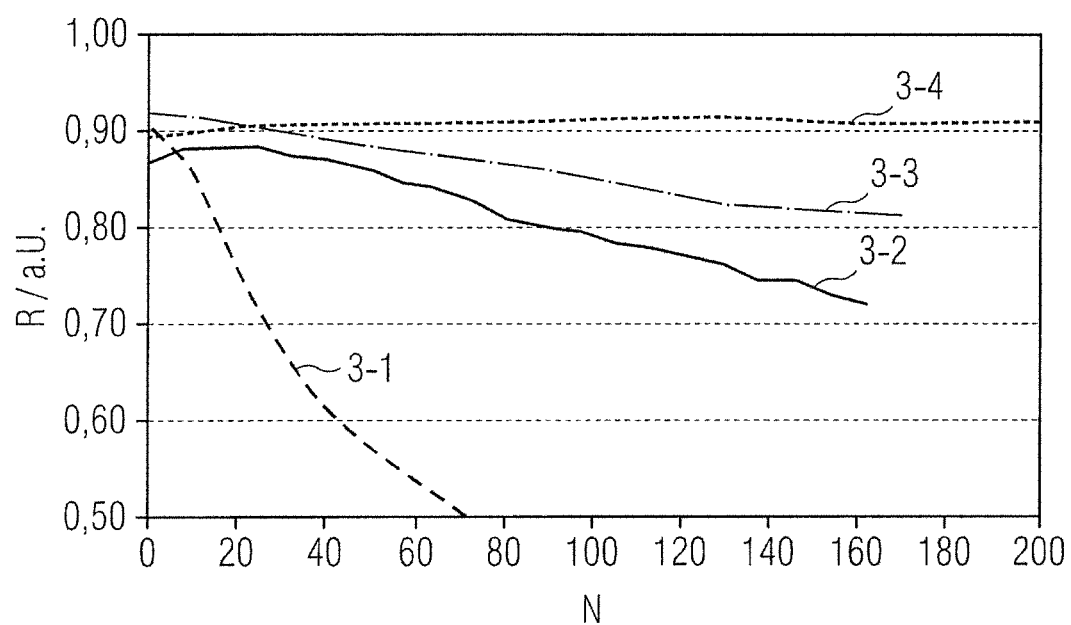
FIG. 3 shows the reflectivity efficiency according to an example.

FIG. 3 shows the reflectivity efficiency R of silver surfaces in arbitrary units (a. U.) depending on the number of climatic cycles N under moisture load. The results also allow conclusions to be drawn about other corrosive media. The effectiveness of the barrier layer stack is thus tested in corrosive environments or environmental influences. The curve 3-1 shows the reflectivity efficiency of the silver, which has no barrier layer stack or other protective layers. The curve with the reference sign 3-2 shows the reflectivity efficiency of the silver with a barrier layer stack formed exclusively of a comparatively thin inorganic oxide layer. The curve with the reference sign 3-3 shows the reflectivity efficiency of a barrier layer stack formed exclusively of a comparatively thick plasma-polymerized siloxane layer. The curve with the reference sign 3-4 shows the barrier layer stack 8, in this example a barrier layer stack having a combination of an inorganic oxide layer and a plasma-polymerized siloxane layer. It can be seen from the curves that, by combining the inorganic oxide, oxynitride or nitride layer with the plasma-polymerized siloxane layer, a stable high reflectivity of more than 0.9 can be produced, which is independent of the number of climatic cycles N.

Figure 4A:
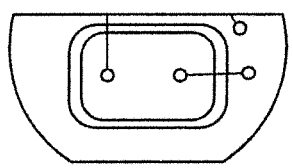
FIGS. 4A to 4E show corrosion tests.

FIGS. 4A to 4E show corrosion tests, wherein a semiconductor chip 1 was provided. The barrier layer stack has an inorganic oxide layer made of aluminum oxide and a plasma-polymerized siloxane layer made of HDMSO. FIG. 4A shows the result of a corrosion test, wherein the barrier layer stack is formed of a plasma-polymerized siloxane layer, an inorganic oxide layer made of aluminum oxide and a further plasma-polymerized siloxane layer made of HDMSO. No corrosion can be seen so that the barrier layer stack has a good barrier effect. No corrosion can be detected at the interfaces, specifically the interface to the chip adhesive.

Figure 4B:
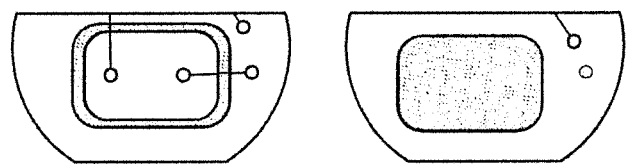

In comparison thereto, FIG. 4B shows an optoelectronic device 100 having only one inorganic barrier layer made of aluminum. The inorganic barrier layer is applied by sputtering. It can be seen from the figure that the latter has a good barrier function, but has cracks at the interfaces and exhibits corrosion that has spread out in the region of the chip adhesive.

Figure 4C:
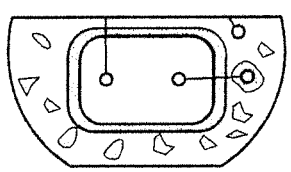
Figure 4D:
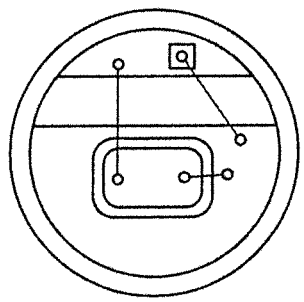
Figure 4E:
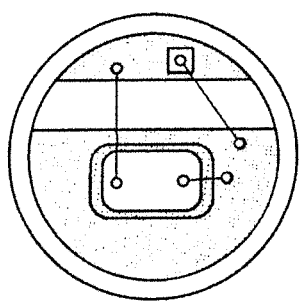

FIG. 4C shows an optoelectronic device 100 that only has a plasma-polymerized siloxane layer composed of HDMSO as a barrier layer. In this example, a poor barrier effect can be seen. FIGS. 4D and 4E show a further corrosion test. FIG. 4D shows the optoelectronic device prior to application of the corrosion test, and FIG. 4E after application of the corrosion test. The device of FIGS. 4D and 4E has no coating. It can be seen from the figures that the barrier layer stack has particularly efficient corrosion resistance compared to the other barrier layer stacks.

For the optoelectronic device described here, at least 90 percent of the initial brightness could be determined after 500 hours in 15 ppm of hydrogen sulfide at 25° C. and 75 percent relative humidity. By such a barrier layer stack 8, metallic reflecting surfaces, in particular silver surfaces, can be excellently used for optoelectronic devices. The coating with silver is significantly more cost-effective compared to, for example, a coating with gold, and leads, above all, to significantly more efficient optoelectronic devices due to the higher reflectivity over the visible spectral range. As a result of this higher reflectivity, the use of volume-emitter semiconductor chips is made possible, as a result of which further cost and efficiency advantages arise. In addition to the metallic reflecting surface, other component surfaces such as the bonding wires can also be coated. In addition, by the barrier layer stack mentioned here, the metallic reflecting surfaces such as, for example, silver surfaces of bonding wires or substrates, are protected from discoloration as, for example, when highly phenylized or HRI silicones for encapsulation are used. The latter lead to a higher brightness or an increased efficiency of the optoelectronic device.

The examples described in conjunction with the figures and the features thereof can also be combined with one another in accordance with further examples, even if such combinations are not explicitly described or shown in the figures. Furthermore, the examples described in conjunction with the figures can have additional or alternative features according to the description in the general part.

Our devices and methods are not restricted to the examples by the description on the basis of the examples. Rather, this disclosure encompasses any new feature and also any combination of features, which includes in particular any combination of features in the appended claims, even if the feature or combination itself is not explicitly specified in the claims or examples.

This application claims priority of DE 10 2016 115 921.2, the subject matter of which is incorporated herein by reference.

The invention claimed is:

1. An optoelectronic device comprising:
   at least one optoelectronic semiconductor chip that emits radiation,
   at least one metallic reflecting surface,
   at least one functional component having a component surface different from the metallic reflecting surface, and
   a barrier layer stack for protection against corrosive gases arranged both on the at least one metallic reflecting surface and the component surface,
   wherein the barrier layer stack comprises at least one inorganic oxide, oxynitride or nitride layer and at least one plasma-polymerized siloxane layer.

2. The optoelectronic device according to claim 1, wherein a further plasma-polymerized siloxane layer is directly to arranged after both the at least one metallic reflecting surface and the component surface, and the inorganic oxide, oxynitride or nitride layer is subordinated to the further plasma-polymerized siloxane layer.

3. The optoelectronic device according to claim 2, wherein the plasma-polymerized siloxane layer is to arranged after the inorganic oxide, oxynitride or nitride layer.

4. The optoelectronic device according to claim 1, wherein the component surface is non-metallic.

5. The optoelectronic device according to claim 1, wherein the functional component is the semiconductor chip, a bonding wire, a carrier, a lead frame, an adhesive that mounts the semiconductor chip, an ESP semiconductor chip and/or a plastic housing.

6. The optoelectronic device according to claim 1, wherein the inorganic oxide, oxynitride or nitride layer comprises oxides, oxynitrides or nitrides of one or more elements selected from the group consisting of silicon, aluminum, titanium, zinc, indium, tin, niobium, tantalum, hafnium, zirconium, yttrium and germanium.

7. The optoelectronic device according to claim 1, wherein the plasma-polymerized siloxane layer is produced from a precursor selected from the group consisting of hexamethyldisiloxane, tetramethyldisiloxane and divinyltetramethyldisiloxane.

8. The optoelectronic device according to claim 1, wherein the metallic reflecting surface is made of silver or a silver-containing alloy.

9. The optoelectronic device according to claim 1, wherein the inorganic oxide, oxynitride or nitride layer has a layer thickness of 5 nm to 100 nm.

10. The optoelectronic device according to claim 1, wherein the plasma-polymerized siloxane layer has a layer thickness of 5 nm to 2 μm.

11. The optoelectronic device according to claim 1, wherein the barrier layer stack covers, at least in regions, the surfaces of a semiconductor chip, a contact and the housing.

12. The optoelectronic device according to claim 1, wherein the inorganic oxide, oxynitride or nitride layer is directly subordinated both on the at least one metallic reflecting surface and the component surface, and the plasma-polymerized siloxane layer is arranged after the inorganic oxide, oxynitride or nitride layer.

13. The optoelectronic device according to claim 1, wherein the plasma-polymerized siloxane layer forms the final layer of the barrier layer stack.

14. A method of producing an optoelectronic device comprising:
A) providing at least one optoelectronic semiconductor chip that emits radiation, at least one metallic reflecting surface and at least one functional component having a component surface different from the metallic reflecting surface, and
B) applying a barrier layer stack for protection against corrosive gases both on the at least one metallic reflecting surface and the component surface, wherein the barrier layer stack is formed by producing at least one inorganic oxide, oxynitride or nitride layer and at least one plasma-polymerized siloxane layer.

15. The method according to claim 14, wherein, during deposition of the plasma-polymerized siloxane layer, one or more deposition parameters are varied as a result of which the plasma-polymerized siloxane layer has gradients.

16. The method according to claim 14, wherein, prior to step B), the metallic reflecting surface and the component surface are treated by plasma.

17. The method according to claim 14, wherein the barrier layer stack is applied after contacting an electrical contact.

* * * * *